US010256270B2

(12) United States Patent
Margutti et al.

(10) Patent No.: US 10,256,270 B2
(45) Date of Patent: Apr. 9, 2019

(54) METHOD FOR MANUFACTURING IMPROVED NIR CMOS SENSORS (71) Applicant: LFOUNDRY S.R.L., Avezzano (IT)

(72) Inventors: Giovanni Margutti, Avezzano (IT); Andrea Del Monte, Avezzano (IT)

(73) Assignee: LFOUNDRY S.R.L. (IT)

(*) Notice: Subject to any disclaimer, the term of this patent is extended or adjusted under 35 U.S.C. 154(b) by 0 days.

(21) Appl. No.: 16/068,724

(22) PCT Filed: Dec. 30, 2016

(86) PCT No.: PCT/EP2016/082948
§ 371 (c)(1),
(2) Date: Jul. 9, 2018

(87) PCT Pub. No.: WO2017/121630
PCT Pub. Date: Jul. 20, 2017

(65) Prior Publication Data
US 2019/0027532 A1    Jan. 24, 2019

(30) Foreign Application Priority Data
Jan. 13, 2016  (IT) .................. 102016000002587

(51) Int. Cl.
*H01L 27/146*    (2006.01)

(52) U.S. Cl.
CPC .... *H01L 27/14689* (2013.01); *H01L 27/1461* (2013.01); *H01L 27/14645* (2013.01);
(Continued)

(58) Field of Classification Search
CPC .......... H01L 27/14689; H01L 27/1461; H01L 27/14698; H01L 27/14649;
(Continued)

(56) References Cited

U.S. PATENT DOCUMENTS

| 5,426,069 A | 6/1995 | Selvakumar et al. |
| 2009/0014764 A1 | 1/2009 | Coudrain et al. |
| 2014/0312386 A1 | 10/2014 | Huang et al. |

FOREIGN PATENT DOCUMENTS

KR    20060122257    11/2006

OTHER PUBLICATIONS

Corresponding International Search Report for PCT/EP2016/082948 dated Mar. 1, 2017. WO.

*Primary Examiner* — Anthony Ho
(74) *Attorney, Agent, or Firm* — The Belles Group, P.C.

(57) ABSTRACT

A method for manufacturing a CMOS image sensor for near infrared detection. The method includes: a) providing a silicon wafer; b) performing a germanium implantation in a portion of a front side of the silicon wafer; c) performing an annealing so as to cause thermal diffusion of implanted germanium species, thereby forming silicon-germanium alloy lattice in a first silicon-germanium region exposed on the front side of the silicon wafer; d) carrying out the steps b) and c) one or more times; and e) forming first photodetector active areas in portions of the first silicon-germanium region downwards extending from the front side of the silicon wafer, wherein said first photodetector active areas are sensitive to both near infrared and visible radiations. The first photodetector active areas are formed also in portions of the silicon wafer extending below said portions of the first silicon-germanium region.

10 Claims, 6 Drawing Sheets (52) U.S. Cl.
CPC .. *H01L 27/14649* (2013.01); *H01L 27/14687* (2013.01); *H01L 27/14698* (2013.01); *H01L 27/1464* (2013.01); *H01L 27/14636* (2013.01)

(58) Field of Classification Search
CPC ......... H01L 27/14687; H01L 27/14645; H01L 27/14636; H01L 27/1464
See application file for complete search history.

METHOD FOR MANUFACTURING IMPROVED NIR CMOS SENSORS

CROSS-REFERENCE TO RELATED PATENT APPLICATIONS

The present application is a U.S. national stage application under 35 U.S.C. § 371 of PCT Application No. PCT/EP2016/082948, filed Dec. 30, 2016, which claims priority to Italian Patent Application No. 102016000002587, filed Jan. 13, 2016, the entireties of which are incorporated herein by reference.

TECHNICAL FIELD OF THE INVENTION

The present invention relates, in general, to sensors based on complementary metal-oxide-semiconductor (CMOS) technology for near infrared (NIR) radiation detection (i.e., for detection of electromagnetic radiation having wavelengths comprised between approximately 0.75 µm and 1.4 µm) and, in particular, to a method for manufacturing improved NIR CMOS sensors.

BACKGROUND ART

As is known, a practical problem related to infrared detection in a silicon (Si) photodiode is the difficulty of generating and collecting charges, as the low energy of the infrared radiation reduces the chance of electron transition from Si valence band to Si conduction band. For example, 30 µm silicon depth is required to convert 90% of the light at 830 nm wavelength. Furthermore, since so deep photodiodes are not easy to be realized, electrons photo-generated in the deepest portion of a Si photodiode diffuse and are collected by adjacent photodiodes, thereby causing cross-talk.

Therefore, current photodiodes sensitive to NIR radiation are manufactured with a thick Si epitaxial layer having low doping, in order to increase the chance of collection of photo-generated charges. Once generated, said charges diffuse in all directions and only some of them are collected by the photodiodes located where the photons impinge.

It is also possible to introduce a doping gradient in the Si bulk substrate so that electrons drift towards the Si surface; however, the doping concentration must be low enough in order to avoid recombination of electrons along the path; furthermore, this cannot avoid that electrons generated by a photon impinging on a photodiode may be collected by an adjacent photodiode (cross-talk).

Moreover, also germanium (Ge) and silicon-germanium (SiGe) alloys have been used, instead of Si, as photosensitive films/layers in NIR photodetectors due to their higher absorption coefficients in NIR wavelength spectrum. Conventionally, Ge layers are deposited by means of chemical vapor deposition (CVD), physical vapor deposition (PVD) or molecular beam epitaxy (MBE), but a Ge high-quality epitaxial film is difficult to be obtained.

In this respect, U.S. Pat. No. 7,008,813 B1 discloses a process for growing a good quality Ge epitaxial layer on a Si wafer by using a liquid phase epitaxy (LPE) process. In detail, U.S. Pat. No. 7,008,813 B1 describes a method of fabricating a germanium photodetector, that includes: preparing a silicon substrate having a layer of silicon nitride thereon; depositing a first germanium layer on the silicon nitride layer so that a portion of said germanium layer is in direct physical contact with the silicon substrate; encapsulating the germanium layer with a layer of silicon oxide; annealing the structure at a temperature such that the germanium melts and the other layers remain solid, wherein a rapid thermal annealing (RTA) is performed at 900-1000° C.; and growing a second, single-crystal layer of germanium on the structure by liquid phase epitaxy (LPE). According to U.S. Pat. No. 7,008,813 B1, when a single crystalline germanium is formed, the defects are concentrated at the silicon-germanium interface where the growth front begins.

Another US patent, namely U.S. Pat. No. 7,157,300 B2, discloses a method for fabricating a germanium-based IR sensor, which method solves the problem of high temperature need for germanium integrated circuits (IC) processes, i.e., ion implantation activation processes are usually performed following an annealing at about 800° C. Such high temperature processes degrade the quality of germanium thin films, because the thermal expansion coefficient of silicon, germanium and silicon dioxide are different. A high temperature process performed on a Ge thin film bonded to a Si wafer usually results in defects in the Ge layer(s), as described in U.S. Pat. No. 6,645,831 B1. In particular, the method according to U.S. Pat. No. 7,157,300 B2 exploits a Ge thin film directly bonded to a Si bulk substrate to preserve the quality of the Ge crystal layer by avoiding the need for high temperature processes after germanium bonding.

Attempts have been also made to directly deposit SiGe alloys on silicon to fabricate an IR detector. However the SiGe has a different lattice cell size compared to the silicon one. This fact causes a not negligible stress when a SiGe layer is grown/deposited on top of silicon. This lattice mismatch limits the maximum SiGe thickness which may be formed. Germanium has a high IR absorption coefficient, however a 4% lattice mismatch to silicon results in a high dark current when a germanium photodetector is fabricated by direct deposition of germanium on silicon.

In this connection, U.S. Pat. No. 7,786,469 B2 describes a thermal sensor with a SiGe superlattice structure formed on an SOI (Si-on-insulator) wafer and bonded to a Si wafer where a CMOS readout circuitry is fabricated. In particular, after a proper surface cleaning, the SOI wafer is loaded into SiGe deposition system which can be MBE, CVD or plasma CVD.

Additionally, KR 2006 0122257 A discloses a method for manufacturing a photodiode and an image sensor to improve light receiving capability and to fabricate the photodiode on a cheap silicon substrate. In particular, according to KR 2006 0122257 A, germanium ions are implanted into a photodiode forming region. The implanted germanium ions are annealed. A Shallow Trench Isolation (STI) is formed in a silicon substrate. N-type dopants are implanted into the photodiode forming region. P-type dopants are then implanted into the photodiode forming region, thereby forming a photodiode on the cheap silicon substrate.

OBJECT AND SUMMARY OF THE INVENTION

A general object of the present invention is that of providing a methodology for manufacturing NIR CMOS sensors, which methodology allows to overcome, at least in part, the aforesaid technical drawbacks.

Moreover, a first specific object of the present invention is that of increasing quantum efficiency of NIR CMOS photodetectors.

Additionally, a second specific object of the present invention is that of achieving a better separation among adjacent photodetectors and a reduced cross-talk in a NIR CMOS sensor.

These and other objects are achieved by the present invention in that it relates to a method for manufacturing a CMOS image sensor for near infrared detection, as defined in the appended claims.

In particular, the method according to the present invention includes:
 a) providing a silicon wafer;
 b) performing a germanium implantation in a portion of a front side of the silicon wafer;
 c) performing an annealing so as to cause thermal diffusion of implanted germanium species, thereby forming silicon-germanium alloy lattice in a first silicon-germanium region exposed on the front side of the silicon wafer;
 d) carrying out the steps b) and c) one or more times; and
 e) forming first photodetector active areas in portions of the first silicon-germanium region downwards extending from the front side of the silicon wafer, wherein said first photodetector active areas are sensitive to both near infrared and visible radiations.

The method according to the present invention is characterized in that the first photodetector active areas are formed also in portions of the silicon wafer extending below said portions of the first silicon-germanium region.

Conveniently, the step e) includes forming also second photodetector active areas in portions of the front side of the silicon wafer outside the first silicon-germanium region, wherein said second photodetector active areas are sensitive only to visible radiation.

Preferably, the silicon wafer comprises a silicon substrate, and an epitaxial silicon layer grown on said silicon substrate and exposed on the front side of said silicon wafer; the germanium implantation is performed in a portion of the epitaxial silicon layer, which portion of the epitaxial silicon layer is exposed on the front side of said silicon wafer; the first silicon-germanium region is formed in the germanium-implanted portion of the epitaxial silicon layer; and the first photodetector active areas are formed:
 in portions of the first silicon-germanium region downwards extending from the front side of the silicon wafer, and
 also in portions of the epitaxial silicon layer extending below said portions of the first silicon-germanium region.

Conveniently, the step e) further includes forming a multi-layered structure on the front side of the silicon wafer, said multi-layered structure including dielectric layers, metal layers and/or lines, poly lines, contacts and vias.

Preferably, the manufactured CMOS image sensor is a front-side CMOS image sensor, and the multi-layered structure further includes color filters and microlenses.

Alternatively, the manufactured CMOS image sensor is a back-side CMOS image sensor, and the method further includes:
 f) flipping the silicon wafer upside down, attaching a carrier wafer to the multi-layered structure, and thinning down the silicon wafer so as to obtain a predefined thickness thereof and to expose a back side thereof;
 g) performing a further germanium implantation in a portion of the exposed back side of the silicon wafer, which germanium-implanted portion of the exposed back side of the silicon wafer extends above the first silicon-germanium region; and
 h) performing a further annealing to cause activation of implanted germanium species, thereby forming silicon-germanium alloy lattice in a second silicon-germanium region exposed on the back side of the silicon wafer.

Conveniently, the second silicon-germanium region extends from the back side of the silicon wafer down to:
 the first silicon-germanium region, thereby forming a single silicon-germanium region with the latter;
 or the first photodetector active areas without reaching the first silicon-germanium region.

Conveniently, the silicon wafer comprises a silicon substrate, and an epitaxial silicon layer grown on said silicon substrate and exposed on the front side of said silicon wafer; the germanium implantation is performed in a first portion of the epitaxial silicon layer, which first portion of the epitaxial silicon layer is exposed on the front side of said silicon wafer; the first silicon-germanium region is formed in said first portion of the epitaxial silicon layer; the silicon wafer is thinned down by removing the silicon substrate so as to expose the epitaxial silicon layer on a back side of the silicon wafer; the further germanium implantation is performed in a second portion of the epitaxial silicon layer, which second portion of the epitaxial silicon layer is exposed on the back side of the silicon wafer and extends above the first silicon-germanium region; and the second silicon-germanium region is formed in said second portion of the epitaxial silicon layer.

Conveniently, the step h) includes carrying out a thermal annealing or a laser annealing or a microwave annealing.

BRIEF DESCRIPTION OF THE DRAWINGS

For a better understanding of the present invention, preferred embodiments, which are intended purely by way of example and are not to be construed as limiting, will now be described with reference to the attached drawings (not to scale), where.

DETAILED DESCRIPTION OF PREFERRED EMBODIMENTS OF THE INVENTION

The following discussion is presented to enable a person skilled in the art to make and use the invention. Various modifications to the embodiments will be readily apparent to those skilled in the art, without departing from the scope of the present invention as claimed. Thus, the present invention is not intended to be limited to the embodiments shown and described, but is to be accorded the widest scope consistent with the principles and features disclosed herein and defined in the appended claims.

The present invention stems from Applicant's idea of increasing quantum efficiency of NIR CMOS photodetectors by exploiting germanium implantation to manufacture photodetector active areas based on SiGe alloy, that has higher absorption coefficient than Si in the NIR wavelength range. In particular, such a higher absorption coefficient allows to reduce active areas' depth, thereby achieving a better separation among adjacent photodetectors and also a reduced cross-talk.

Figure 1:
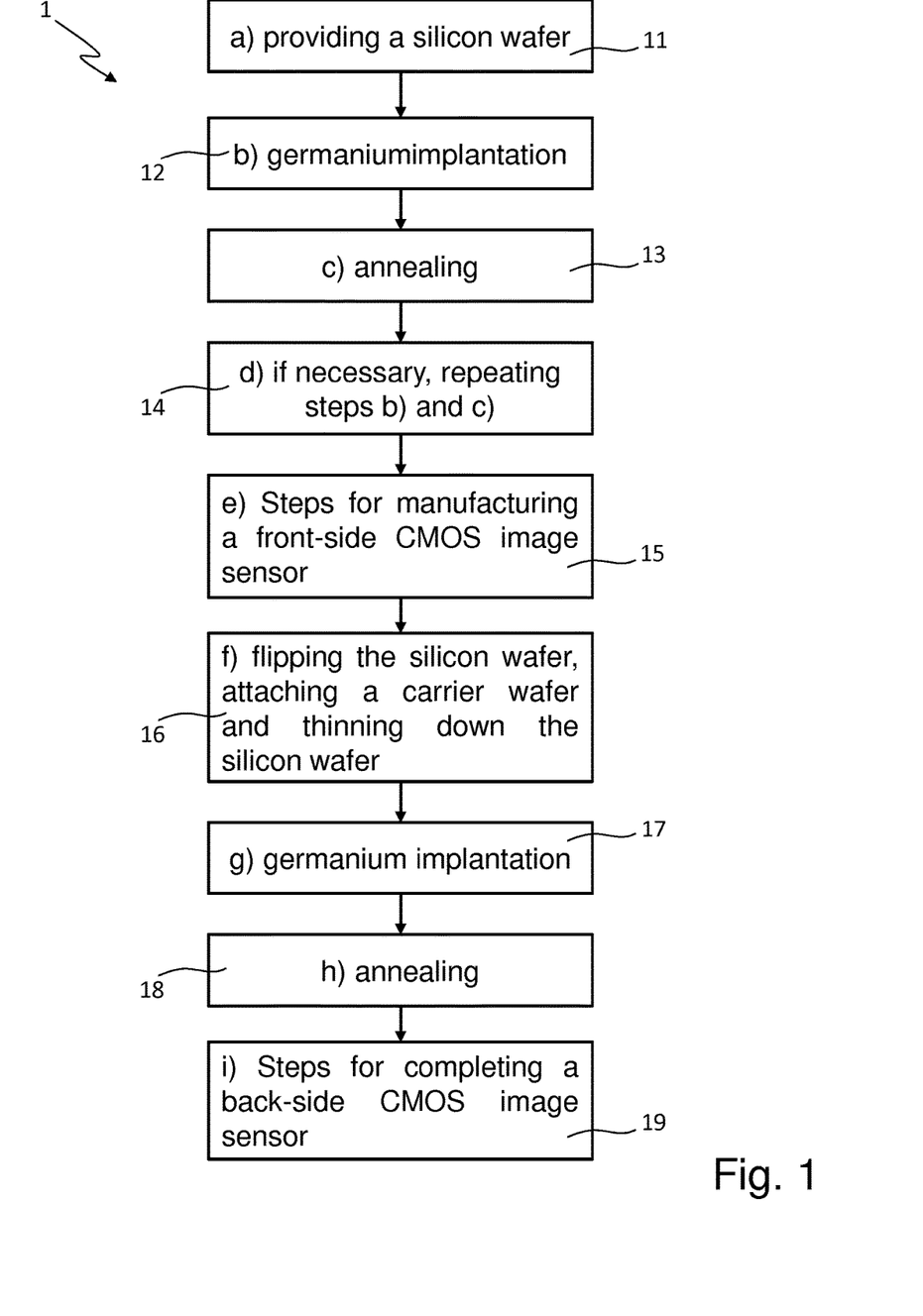
FIG. 1 schematically illustrates a method for manufacturing a CMOS image sensor for NIR detection according to a preferred embodiment of the present invention.

For a better understanding of the present invention, FIG. 1 shows, by means of a flow chart, a method (denoted as a whole by 1) for manufacturing a CMOS image sensor for NIR detection according to a preferred embodiment of the present invention.

In particular, the method 1 includes:

a) providing a Si wafer (block 11);

b) performing a germanium implantation (block 12) in one or more portions of a front side of the Si wafer, conveniently by carrying out a photolithography process including forming a patterned photoresist mask on the front side of Si wafer, implanting Ge ions through one or more apertures of the photoresist mask, removing said photoresist mask, and cleaning;

c) performing an annealing process (block 13) so as to cause thermal diffusion of the implanted Ge species, thereby forming SiGe alloy lattice in one or more SiGe regions exposed on the front side of the Si wafer;

d) if necessary, in order to obtain a desired Ge concentration profile, repeating the steps 2 and 3 (i.e., blocks 12 and 13) one or more times (block 14); and e) carrying out steps for manufacturing a front-side CMOS image sensor (block 15), preferably including forming visible-NIR photodetector active areas in portions of the SiGe region(s) downwards extending from the front side of the Si wafer and, conveniently, also in portions of the Si wafer extending below said portions of the SiGe region(s), and forming visible-only photodetector active areas in portions of the front side of the Si wafer outside the SiGe region(s).

Said steps a) to e) (blocks 11-15) of the method 1 allow to manufacture a front-side CMOS image sensor comprising photodetectors sensitive to both NIR and visible radiations (i.e., the aforesaid visible-NIR photodetector active areas) and also photodetectors sensitive only to visible radiation (i.e., the aforesaid visible-only photodetector active areas).

Figure 2:
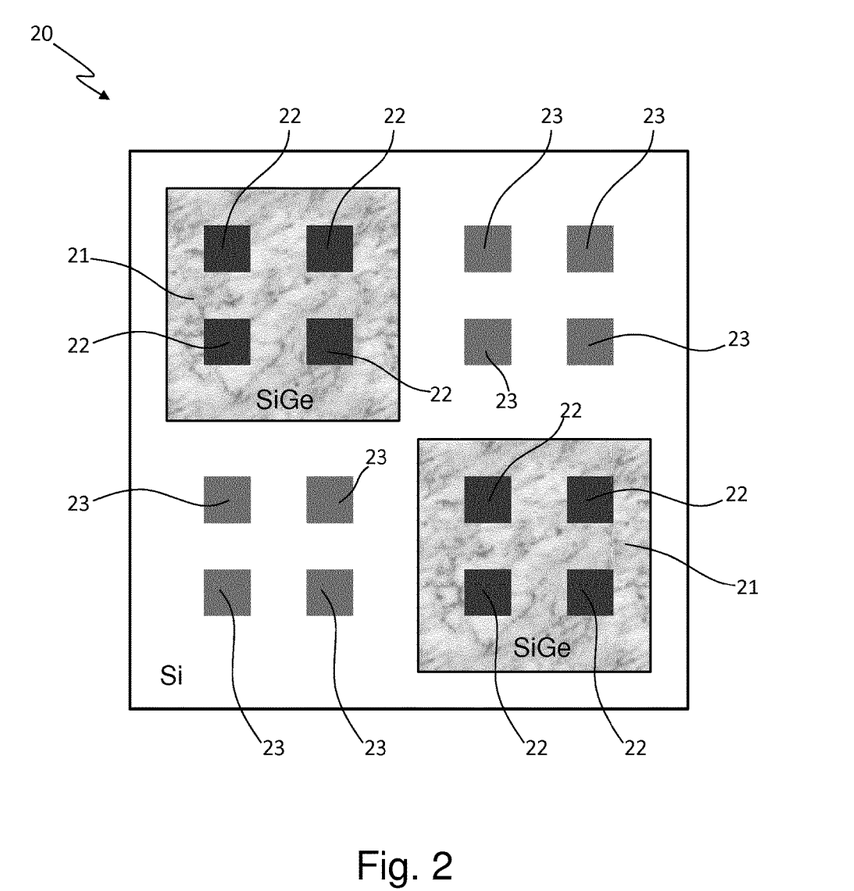
FIGS. 2-4 show examples of, respectively, a first silicon wafer, a second silicon wafer and a front-side CMOS image sensor obtained by carrying out several steps of the method of FIG. 1.

In this connection, FIG. 2 shows, by way of example, a front side of a Si wafer (denoted as a whole by 20), which includes:

two SiGe regions 21 formed by carrying out the steps b), c) and d) (blocks 12-14) of the method 1;

eight visible-NIR photodetector active areas 22 formed in respective portions of said SiGe regions 21; and eight visible-only photodetector active areas 23 formed in respective portions of the Si wafer 20 outside said SiGe regions 21, wherein said visible-NIR photodetector active areas 22 and said visible-only photodetector active areas 23 have been formed by carrying out said step e) (block 15) of the method 1.

In order to obtain photodetectors sensitive only to NIR radiation, the visible-NIR photodetector active areas 22 can be conveniently fitted with filtering means for filtering out visible radiation (not shown in FIG. 2).

Alternatively, in said step e) (block 15) of the method 1 only visible-NIR photodetector active areas can be formed so as to obtain a front-side CMOS image sensor comprising only photodetectors sensitive to both NIR and visible radiations. Also in this case the photodetectors can be conveniently fitted with visible radiation filtering means so as to obtain a front-side CMOS image sensor sensitive only to NIR radiation.

Conveniently, said step e) (block 15) of the method 1 further includes forming a multi-layered structure on the front side of the Si wafer, said multi-layered structure conveniently including dielectric layers, metal layers and/or lines, poly lines, contacts, vias, color filters and microlenses.

More conveniently, said step e) (block 15) of the method 1 includes also:

forming shallow trench isolation (STI) regions; and forming transfer gates and CMOS readout circuitry.

Moreover, a specific preferred embodiment of the method 1 provides that:

the Si wafer comprises a Si bulk substrate, and an epitaxial (Epi) Si layer grown thereon and exposed on the front side of said Si wafer;

the germanium implantation is performed in one or more portions of said Epi Si layer, which portion(s) of said Epi Si layer is/are exposed on the front side of said Si wafer;

the one or more SiGe regions is/are formed in said germanium-implanted portion(s) of said Epi Si layer; and the visible-NIR photodetector active areas are formed in portions of the SiGe region(s) downwards extending from the front side of the Si wafer and, conveniently, also in portions of said Epi Si layer extending below said portions of the SiGe region(s).

Figure 3:
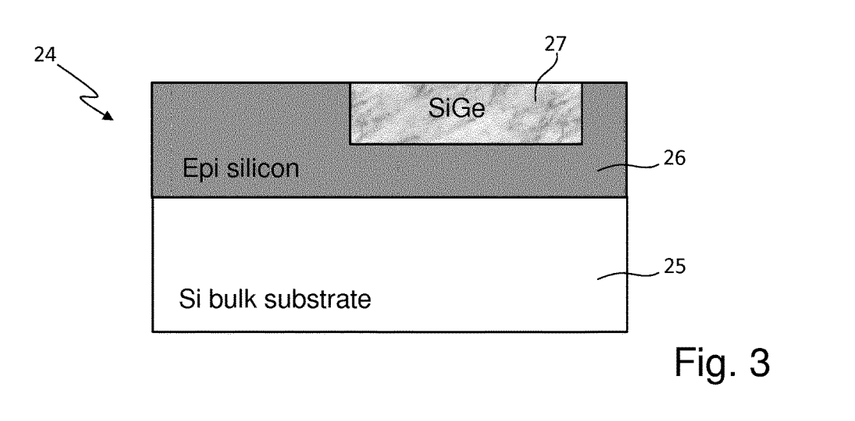

In this connection, FIG. 3 shows, by way of example, a Si wafer (denoted as a whole by 24) obtained by carrying out the steps a) to d) (blocks 11-14) of the method 1 according to the aforesaid specific preferred embodiment.

In particular, FIG. 3 is a cross-sectional view of the Si wafer 24, which includes:

a Si bulk substrate 25;

an Epi Si layer 26 grown on said silicon substrate 25; and a SiGe region 27 formed in a top portion of the Epi Si layer 26.

Conveniently, said SiGe region 27 can be formed in a top portion of the Epi Si layer 26 in which it is intended to form:

the whole pixel array of a CMOS image sensor (including or excluding regions in which transfer gates are formed); or only a portion of the pixel array dedicated to NIR detection.

Figure 4:
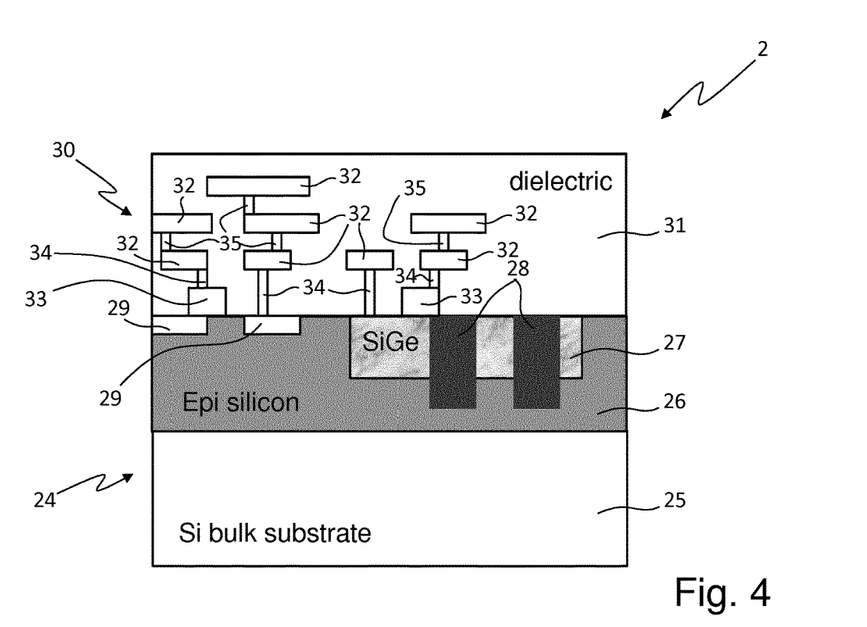

Additionally, FIG. 4 shows, by way of example, a front-side CMOS image sensor (denoted as a whole by 2) obtained by carrying out the steps a) to e) (blocks 11-15) of the method 1 according to the aforesaid specific preferred embodiment.

In particular, FIG. 4 is a cross-sectional view of the front-side CMOS image sensor 2, which includes:

the Si wafer 24;

visible-NIR photodetector active areas 28 formed in portions of the SiGe region 27 and in corresponding portions of the Epi Si layer 26 extending therebelow;

drain and source areas 29 formed in further top portions of the Epi Si layer 26 outside the SiGe region 27; and a multi-layered structure 30 formed on the Epi Si layer 26 and the SiGe region 27 and including dielectric layers 31, metal lines 32, poly lines 33, contacts 34 and vias 35.

Figure 5:
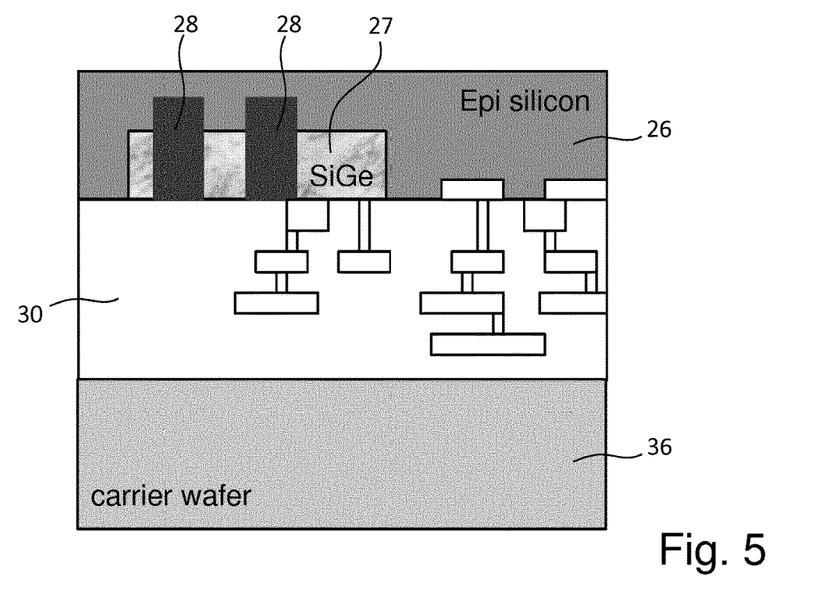
FIGS. 5-8 show further steps of the method of FIG. 1 carried out to manufacture a back-side CMOS image sensor.
Figure 6:
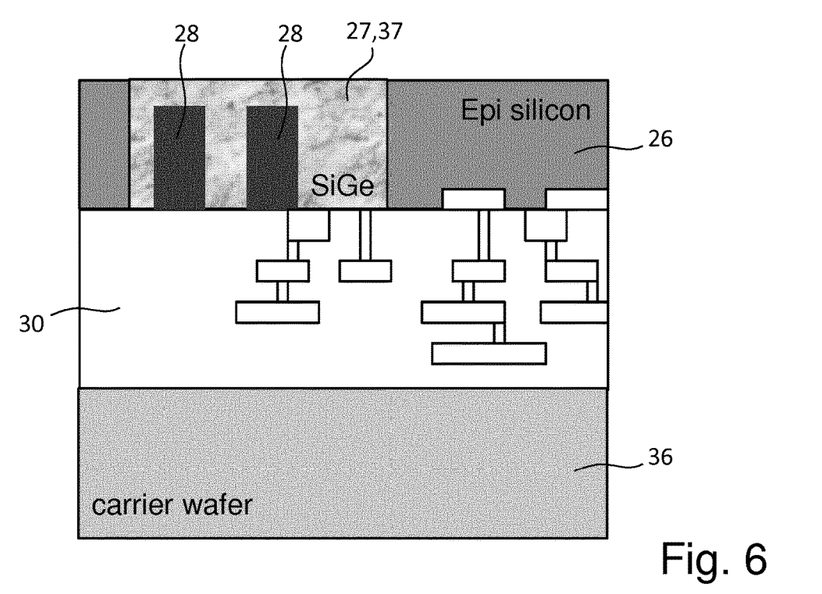
Figure 7:
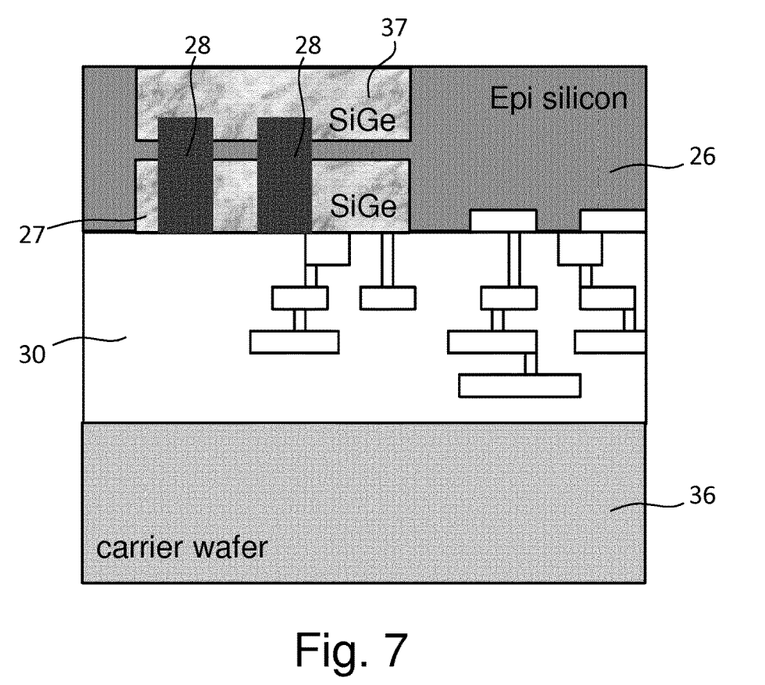
Figure 8:
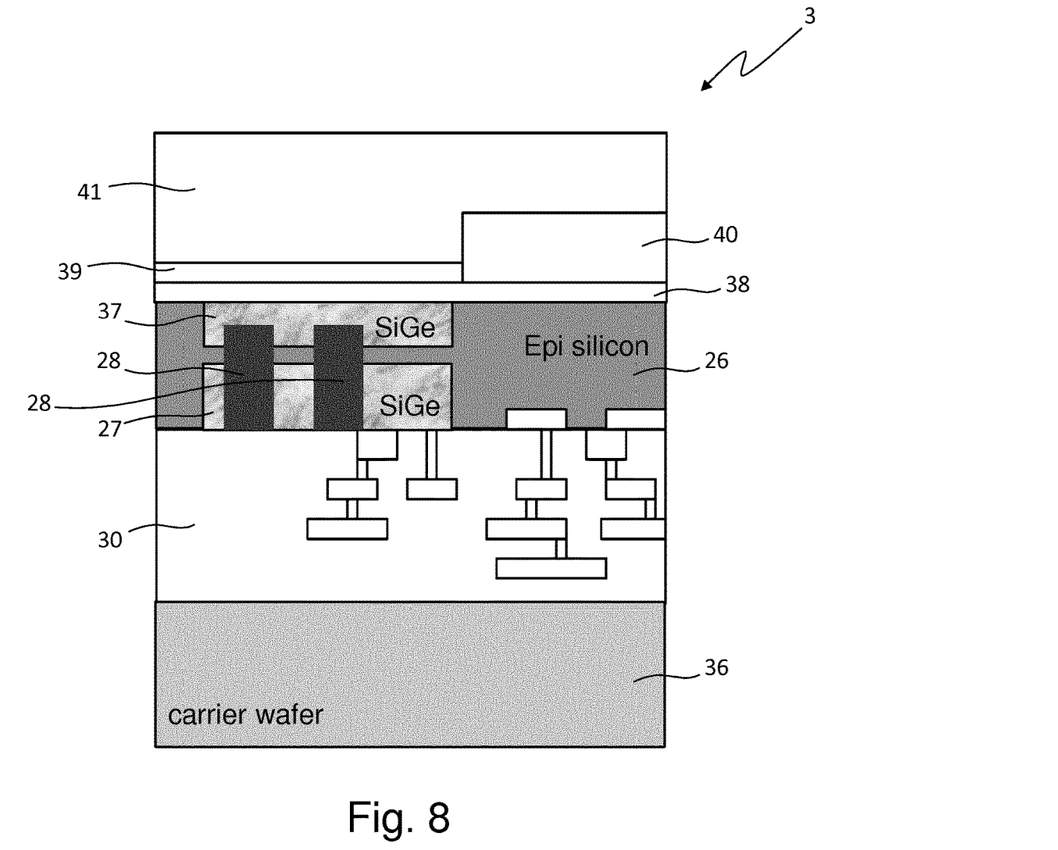

Again with reference to FIGS. 1, 3 and 4 and with further reference to FIGS. 5-8, the method 1 according to the aforesaid specific preferred embodiment, when implemented to manufacture a back-side CMOS image sensor, includes all the above steps a) to e) (blocks 11-15) (except for the fact that the multi-layered structure formed in the step e) (block 15) does not include any color filter and any microlens) and further comprises:

f) flipping the Si wafer 24 upside down, attaching a carrier wafer 36 (such as a Si carrier wafer) to the multi-layered structure 30, and thinning down the Si wafer 24 so as to obtain a predefined thickness thereof and to expose a back side thereof; preferably, thinning down the Si wafer 24 includes removing the Si bulk substrate 25 thereby exposing a back side of the Epi Si layer 26 (block 16 in FIG. 1 in combination with cross-sectional view shown in FIG. 5);

g) performing a further germanium implantation (block 17 in FIG. 1) in a portion of the exposed back side of the Si wafer 24, preferably in a portion of the exposed back side of the Epi Si layer 26, which germanium-implanted portion extends above the SiGe region 27; said step g) (block 17) conveniently including     forming a patterned photoresist mask on the exposed back side of the Epi Si layer 26,     implanting Ge ions through one or more apertures of the photoresist mask,     removing said photoresist mask, and     cleaning;

h) performing a further annealing (block 18 in FIG. 1) to cause activation of implanted Ge species, thereby forming SiGe alloy lattice in a further SiGe region 37, which can extend down to     the SiGe region 27 thereby forming a single SiGe region with the latter (cross-sectional view in FIG. 6),     or, alternatively, the visible-NIR photodetector active areas 28 without reaching the SiGe region 27 (cross-sectional view in FIG. 7); and i) carrying out steps for completing a back-side CMOS image sensor (block 19 in FIG. 1 in combination with cross-sectional view in FIG. 8 where a back-side CMOS image sensor 3 is shown), conveniently including     performing a boron implantation so as to form a p+ passivation layer 38 on the back side of the Epi Si layer 26 and the further SiGe region 37,     performing a yet further annealing,     forming, by successive depositions, an anti-reflective coating 39 on the p+ passivation layer 38,     patterning the anti-reflective coating 39 by means of an etching process and forming metal shielding means 40 so as to shield peripheral regions of the back-side CMOS image sensor 3 from impinging light, and     forming a planarization oxide 41 and, conveniently, color filters and microlenses (which are not shown in FIG. 8 for the sake of illustration simplicity).

Preferably, said step h) (block 18) includes carrying out a laser annealing or a microwave annealing so as to avoid the metal lines 32 from being exposed to temperatures higher than the respective melting ones. Alternatively, a thermal annealing could be used.

The advantages of the present invention are clear from the foregoing. In particular, it is important to underline the fact that the formation of silicon-germanium by means of a Ge ion implantation provides the following advantages:

the present invention solves the problem of lattice mismatch between Si and Ge, or SiGe grown on Si, as germanium implantation allows to form graded SiGe layer and to decrease or tune lattice stress and mismatch of the SiGe alloy;

with the present invention it's possible to selectively implant (for example by using a dedicated photoresist mask) a whole pixel array or only a portion thereof;

with the present invention it's possible to form photodetectors with different SiGe alloys in one and the same pixel array, with separated photo-implant process loops, differentiating dose and energy of germanium implantations;

with the present invention, in case of a back-side CMOS image sensor, the SiGe region can be formed on the back side, on the front side, or on both; and     with the present invention it's possible to achieve a better separation among adjacent photodetectors and a reduced cross-talk.

Additionally, it is worth noting that the formation of implanted SiGe photodetectors with a depth extending in the silicon epitaxial layer provides a better separation amongst photodetectors and a reduced cross-talk.

Finally, it is clear that numerous modifications and variants can be made to the present invention, all falling within the scope of the invention, as defined in the appended claims.

The invention claimed is:

1. Method for manufacturing a CMOS image sensor for near infrared detection, said method including:

a) providing a silicon wafer;

b) performing a germanium implantation in a portion of a front side of the silicon wafer;

c) performing an annealing so as to cause thermal diffusion of implanted germanium species, thereby forming silicon-germanium alloy lattice in a first silicon-germanium region exposed on the front side of the silicon wafer;

d) carrying out the steps b) and c) one or more times; and     e) forming first photodetector active areas in portions of the first silicon-germanium region downwards extending from the front side of the silicon wafer, wherein said first photodetector active areas are sensitive to both near infrared and visible radiations;

wherein said first photodetector active areas are formed also in portions of the silicon wafer extending below said portions of the first silicon-germanium region.

2. The method of claim 1, wherein the step e) includes forming also second photodetector active areas in portions of the front side of the silicon wafer outside the first silicon-germanium region, wherein said second photodetector active areas are sensitive only to visible radiation.

3. The method according to claim 1, wherein:

the silicon wafer comprises:

a silicon substrate, and an epitaxial silicon layer grown on said silicon substrate and exposed on the front side of said silicon wafer;

the germanium implantation is performed in a portion of the epitaxial silicon layer, which portion of the epitaxial silicon layer is exposed on the front side of said silicon wafer; and     the first silicon-germanium region is formed in the germanium-implanted portion of the epitaxial silicon layer;

and wherein the first photodetector active areas are formed:

in portions of the first silicon-germanium region downwards extending from the front side of the silicon wafer, and     also in portions of the epitaxial silicon layer extending below said portions of the first silicon-germanium region.

4. The method according to claim 1, wherein the step e) further includes forming a multi-layered structure on the front side of the silicon wafer, said multi-layered structure including dielectric layers, metal layers and/or lines, poly lines, contacts and vias.

5. The method of claim 4, wherein the manufactured CMOS image sensor is a front-side CMOS image sensor, and wherein the multi-layered structure further includes color filters and microlenses.

6. The method of claim 4, wherein the manufactured CMOS image sensor is a back-side CMOS image sensor, and wherein the method further includes:
   f) flipping the silicon wafer upside down, attaching a carrier wafer to the multi-layered structure, and thinning down the silicon wafer so as to obtain a predefined thickness thereof and to expose a back side thereof;
   g) performing a further germanium implantation in a portion of the exposed back side of the silicon wafer, which germanium-implanted portion of the exposed back side of the silicon wafer extends above the first silicon-germanium region; and
   h) performing a further annealing to cause activation of implanted germanium species, thereby forming silicon-germanium alloy lattice in a second silicon-germanium region on the back side of the silicon wafer.

7. The method of claim 6, wherein the second silicon-germanium region extends from the back side of the silicon wafer down to:
   the first silicon-germanium region, thereby forming a single silicon-germanium region with the latter; or
   the first photodetector active areas without reaching the first silicon-germanium region.

8. The method according to claim 6, wherein:
   the silicon wafer comprises:
      a silicon substrate, and
      an epitaxial silicon layer grown on said silicon substrate and exposed on the front side of said silicon wafer;
   the germanium implantation is performed in a first portion of the epitaxial silicon layer, which first portion of the epitaxial silicon layer is exposed on the front side of said silicon wafer;
   the first silicon-germanium region is formed in said first portion of the epitaxial silicon layer;
   the silicon wafer is thinned down by removing the silicon substrate so as to expose the epitaxial silicon layer on a back side of the silicon wafer;
   the further germanium implantation is performed in a second portion of the epitaxial silicon layer, which second portion of the epitaxial silicon layer is exposed on the back side of the silicon wafer and extends above the first silicon-germanium region; and
   the second silicon-germanium region is formed in said second portion of the epitaxial silicon layer.

9. The method according to claim 6, wherein the step h) includes carrying out a thermal annealing or a laser annealing or a microwave annealing.

10. CMOS image sensor for near infrared detection manufactured by carrying out the method claimed in claim 1.

* * * * *